United States Patent
Carberry et al.

(10) Patent No.: US 7,956,451 B2
(45) Date of Patent: Jun. 7, 2011

(54) PACKAGES FOR ENCAPSULATED SEMICONDUCTOR DEVICES AND METHOD OF MAKING SAME

(75) Inventors: Patrick Joseph Carberry, Laurys Station, PA (US); Jeffery John Gilbert, Schwenksville, PA (US); George John Libricz, Jr., Bethlehem, PA (US); Ralph Salvatore Moyer, Robesonia, PA (US)

(73) Assignee: Agere Systems Inc., Allentown, PA (US)

( * ) Notice: Subject to any disclaimer, the term of this patent is extended or adjusted under 35 U.S.C. 154(b) by 264 days.

(21) Appl. No.: 11/015,535

(22) Filed: Dec. 18, 2004

(65) Prior Publication Data

US 2006/0131704 A1 Jun. 22, 2006

(51) Int. Cl.
*H01L 31/08* (2006.01)
(52) U.S. Cl. ........ 257/687; 257/787; 257/790; 257/668; 257/676; 257/E23.14
(58) Field of Classification Search .................. 257/668, 257/749, 676, 667, 419, 420, 417
See application file for complete search history.

(56) References Cited

U.S. PATENT DOCUMENTS

| 5,581,226 | A | * | 12/1996 | Shah | 338/42 |
| 5,640,746 | A | * | 6/1997 | Knecht et al. | 29/25.35 |
| 6,392,298 | B1 | * | 5/2002 | Leighton et al. | 257/728 |
| 6,512,255 | B2 | * | 1/2003 | Aoki et al. | 257/254 |
| 6,732,590 | B1 | * | 5/2004 | Gottlieb et al. | 73/754 |
| 6,753,482 | B1 | * | 6/2004 | Schoenfeld et al. | 174/261 |
| 6,800,804 | B2 | * | 10/2004 | Igarashi et al. | 174/391 |
| 6,822,339 | B2 | * | 11/2004 | Kageyama | 257/787 |
| 2002/0163001 | A1 | * | 11/2002 | Shaddock | 257/79 |

* cited by examiner

*Primary Examiner* — Junghwa M Im
(74) *Attorney, Agent, or Firm* — Mendelsohn, Drucker & Associates, P.C.; Steve Mendelsohn

(57) ABSTRACT

A semiconductor device package comprises a container having a base and side walls of an electrically insulating material. A semiconductor device chip is disposed on the base, and a lead frame extends through the side walls. At least one electrical conductor couples the lead frame to the chip. A first layer of an electrically insulating cured gel covers the chip and the lead frame, and a second layer of an electrically insulating cured gel covers at least the portion of the first layer that covers the chip, but does not extend to the side walls. In one embodiment, the second layer has the shape of a dome. In a preferred embodiment the gel comprises silicone. In another embodiment a third layer of conformal insulating material is disposed on the second layer and essentially fills the container. Also is described is a method of making the package for use with RFLDMOS chips.

20 Claims, 1 Drawing Sheet

PACKAGES FOR ENCAPSULATED SEMICONDUCTOR DEVICES AND METHOD OF MAKING SAME

BACKGROUND OF THE INVENTION

1. Field of the Invention

This invention relates to semiconductor device packages and, more particularly to encapsulating integrated circuits (ICs) or discrete devices in such packages.

2. Discussion of the Related Art

In the semiconductor device industry it is common to fabricate device packages from a metallic base and plastic or other polymer sidewalls. One of the many potential package types is the known as an open cavity package, which is commonly used in applications where high thermal loads must be handled including, but not limited to, power devices (e.g., radio frequency, laterally diffused MOSFETS or RFLD-MOSFETs). The most common open cavity package includes a high thermal conductivity base, ceramic side walls and imbedded leads. These packages are typically of the hermetic or semi-hermetic variety. In both varieties the semiconductor device or chip is connected to the base and the leads, and the chip is protected from the outside environment by a substantially leak tight, sealed lid. As such, there is no requirement for a semiconductor device encapsulant for environmental protection. For lower cost applications, the ceramic-side walls of the package can be replaced with plastic. Many of the open cavity plastic packages are non-hermetic by design. In this case the semiconductor device must be encapsulated so that unwanted environmental degradation does not occur. The best environmental protection is achieved when the entire cavity (including the semiconductor device, wire bonds, package leads, and package base) is filled with a protective encapsulant (typically in the form a cured gel, such as silicone). However, gel-like encapsulants form a meniscus when cured. Because the meniscus is naturally a depression in the central region of the gel layer, often not all portions of the wires or the chips are completely covered by gel in that central region.

In addition, before the gel is cured, it tends to wick up the side walls of the package and sometimes spills over the top of the package. This problem is exacerbated in low profile packages in which all of the package walls do not have the same height. In this case, the gel tends to wick up the higher walls and spill over the lower walls.

Thus, there is a need in the semiconductor device packaging art for a way to completely encapsulate the wire bonds and the chip without having the uncured gel run out of the package.

In some open cavity package designs, one or more components may even protrude above the top of the walls, in which case the lid would have to be adapted to accommodate the protrusion. However, the spilling problem renders it essentially impossible to use prior art encapsulation techniques to cover such protrusions.

Thus, there a need in the semiconductor packaging art for a way to completely encapsulate such protrusions.

BRIEF SUMMARY OF THE INVENTION

In accordance with one aspect of our invention, a semiconductor device package comprises a container having a base of a thermally conducting material (e.g., metal) and side walls of an electrically insulating material (e.g., plastic). A semiconductor device chip (e.g., an IC chip, a discrete device chip, or both) is disposed on the base, and a lead frame extends through at least one side wall. At least one electrical conductor (e.g., a wire bond) couples the lead frame to the chip. A first layer of an electrically insulating cured gel covers at least a portion of the chip and the lead frame, and a second layer of an electrically insulating cured gel covers at least the portion of the first layer that covers the chip, but does not extend to the side walls. In one embodiment, the second layer has the shape of a dome. In a preferred embodiment the gel comprises silicone. In another embodiment a third layer of conformal insulating material (e.g., HYSOL) is disposed on the second layer and essentially fills the container.

In accordance with another aspect of our invention, a method of making a semiconductor device package comprises the steps of: (a) providing an electrically insulating container having a base and side walls with a lead frame extending through at least one side wall, (b) mounting a semiconductor device chip on the base, (c) wire bonding a multiplicity of electrical conductors between the chip and the lead frame, characterized by the steps of (d) forming a first layer of an electrically insulating curable gel over at least a portion of the chip, the lead frame and the conductors so that the first layer extends to the side walls, (e) curing the first layer, (f) forming a second layer of an electrically insulating curable gel over the first layer so that the second layer covers at least the portion of the first layer that covers the chip and so that the second layer does not extend to the side walls, and (g) curing the second layer.

BRIEF DESCRIPTION OF THE SEVERAL VIEWS OF THE DRAWING

Our invention, together with its various features and advantages, can be readily understood from the following more detailed description taken in conjunction with the accompanying drawing, in which:

Note, in the interests of simplicity and clarity, FIGS. 1 and 2 are not drawn to scale, neither in an absolute sense (compared to the dimensions of an actual package design) nor in a relative sense (compared to one another).

DETAILED DESCRIPTION OF THE INVENTION

Figure 1:
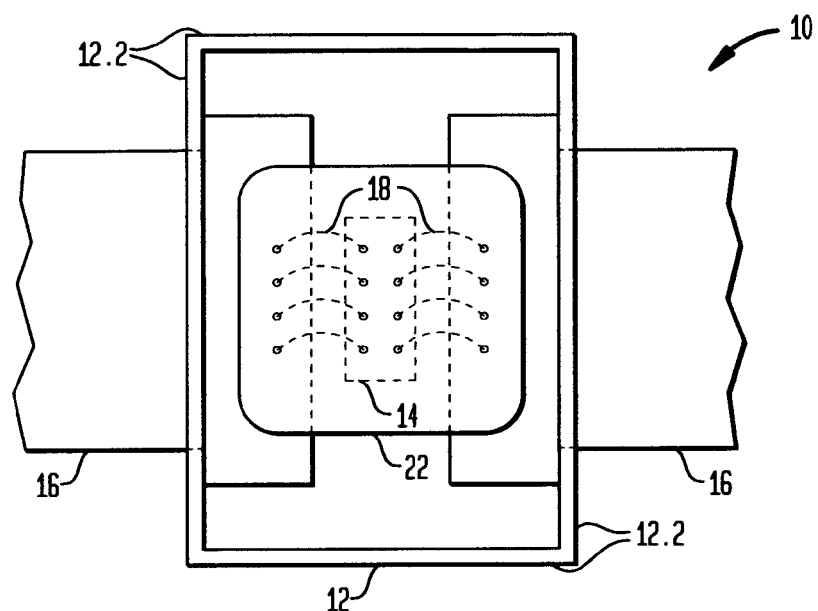
FIG. 1 is a schematic, top view of a semiconductor device package in accordance with one embodiment of our invention.
Figure 2:
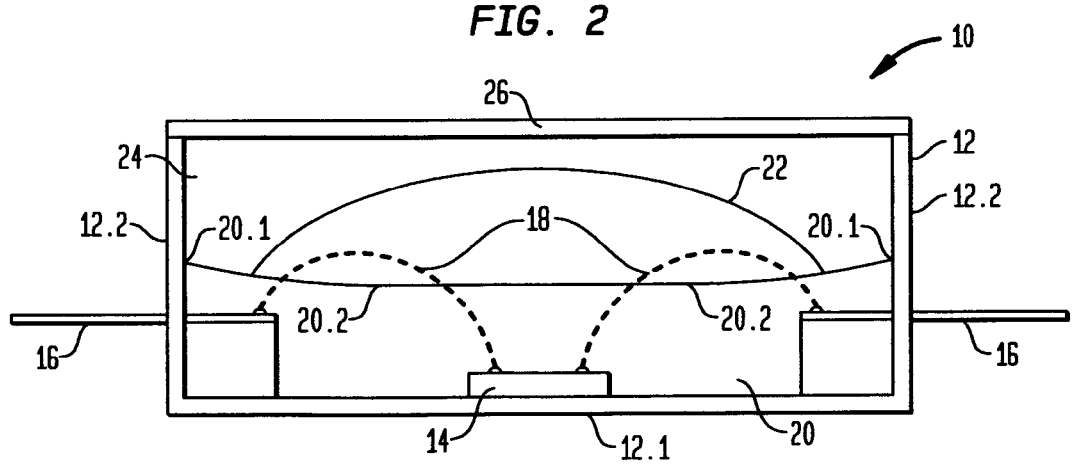
FIG. 2 is a schematic, cross-sectional view of a semiconductor device package in accordance with one embodiment of our invention.

Turning now to FIGS. 1 and 2, we show an IC package 10 in accordance with an illustrative embodiment of our invention. The package, which is made of an electrically insulating material such as a plastic, comprises a container 12 having a thermally conducting base 12.1 and electrically insulating side walls 12.2. The geometric shape of the container is not critical. It is depicted as being a rectangular tub for simplicity, but those skilled in the art would readily appreciate that it could take on other shapes.

At least one semiconductor device chip 14 is mounted on the base. Only one such chip is shown for simplicity, but a multiplicity of chips could be located on the same base within the same container. In addition, a metal lead frame 16 extends through at least one of the side walls 12.2 to points sufficiently close to the chip 14 to enable the lead frame and the chip to be electrically connected by relatively short lengths of wire. (In some cases the lead frame 16 may extend through more than one side wall or through all side walls.) To this end, a multiplicity of electrical conductors 18 (e.g., wires of Au, Al, Cu or alloys of these metals) couple terminals on the lead frame to terminals on the chip.

In accordance with one aspect of our invention, a first layer 20 of an electrically insulating curable gel (e.g., a silicone) is deposited over at least a portion of (but preferably all of) the chip 14 and the lead frame 16. However, it is important in depositing this first layer to take into account that the gel forms a relatively low contact angle with the sidewall 12.2; that is, the first layer wicks up the side walls. Consequently, we have found that when the first layer fills or nearly fills the container, wicking at the interface 20.1 between the gel and the wall causes the gel to run up the side walls and out of the container. (Although it might be possible to simply make the package deeper to avoid such spillage, customer requirements often do not permit such flexibility in design.) As mentioned previously, this problem is exacerbated in low profile packages in which all of the package walls do not have the same height. In this case, the gel tends to wick up the higher walls and spill over the lower walls. Because the first gel layer 20 forms a meniscus when cured, typically it does not completely cover the uppermost portions of the conductors 18, which means that the first gel layer does not run out of the container. After the first layer is deposited, it is cured, typically by a thermal process (e.g., in a hot air oven) to expedite the curing action, but other curing methods are suitable including, for example, those that employ infrared radiation, ultraviolet radiation, or simply time (e.g., at room temperature). In addition, the first layer could be only partially cured during this step, but fully cured during the curing of the second gel layer 22 discussed below.

Next, a second gel layer 22 is deposited on the first layer 20. Importantly, the second layer 22 is deposited so that it does not extend to the sidewalls 12.2; that is, the second layer 22 is recessed from the side walls and covers at least the region defined by the chip and the wire bonds 18. This design feature is realized by controlling the amount of gel material that is deposited (e.g., the weight of gel material that is dispensed and/or the flow rate of that material from the injection head used in the deposition process) and is facilitated by the relatively low wetting of the second gel on the top surface 20.2 of the cured first gel layer 20. As a consequence, the second gel layer 22 typically has the curved shape of a dome or bubble, as shown in the schematic cross-sectional view of FIG. 2. However, the shape of layer 22 in top view, as shown schematically in FIG. 1, is determined largely by the fill pattern; that is, by the pattern traversed by the injection head when it dispenses the gel.

Once the second layer is deposited, it is also cured, by a thermal process (e.g., in a hot air oven) to expedite the curing action, but other curing methods are suitable including, for example, those that employ infrared radiation, ultraviolet radiation, or simply time (e.g., at room temperature). As mentioned above, this step could also result in fully curing the first layer 20 if it had been only partially cured in previous processing.

In one embodiment of our invention, the container includes an optional lid 26, which is also made of electrically insulating material (e.g., a plastic). In general a lid is preferred unless the second gel layer 22 is itself, or is covered with, a sufficiently robust layer to provide physical protection. (See, the discussion of HYSOL, below.) The lid may be flat as shown in FIG. 2, or it may be arched or dome-like as discussed hereinafter.

With or without the presence of a lid, the space above the layers 20 and 22 may be left empty (except for the atmosphere or a neutral gas) or it may be filled with a conformal, relatively hard, protective layer 24 (e.g., an epoxy-based material). An illustrative protective layer 24 is made of HYSOL® FP4470 or a similar material, which is commercially available from the electronics division of Henkel Loctite Corporation located in Industry, Calif.

In general, the gels used for the first and second layers should be chosen to take into account the following considerations. First, the glass transition temperature of the gel should not fall within the operating temperature range of the packaged IC. Second, the coefficient of thermal expansion (CTE) of the gel should be relatively low unless the material has a relatively low Young's modulus (i.e., it is relatively soft, as a cured gel). Third, the gel should be a high purity material, with low concentrations of ions such as Na, Cl, and K to reduce the likelihood of contamination of the semiconductor device and/or the package.

EXAMPLE

This example describes the fabrication of a package for RFLDMOS FET ICs, in accordance with one embodiment of our invention. Various materials, dimensions and operating conditions are provided by way of illustration only and, unless otherwise expressly stated, are not intended to limit the scope of the invention. This type of package illustratively contains six chips: two chips that function as active ICs (i.e., high power RFLDMOS transistors) and four that function as passive ICs (i.e., capacitors).

The container 12 was made of a liquid crystal plastic (LCP) material and had overall dimensions of 810 mils in length and 385 mils in width. As measured from the bottom of the base, one set of side walls (i.e., the end walls along the width dimension of the container) were 155 mils in height, whereas the other set of sidewalls (i.e., those along the length dimension of the container) were 99 mils in height.

The first layer 20 was made of silicone and was about 30 mils thick. The silicone gel was purchased from Dow Corning, Midland, Mich. and was identified as HIPEC® Q3-6646. The first layer was oven cured at a temperature of about 150° C. for about 120 min.

The second layer 22, which had the shape of a dome-like, oval bubble of the type shown in FIG. 1, was also made of silicone. It had a maximum thickness of about 30 mils thick and measured about 500 mils in maximum length and 250 mils in maximum width. The silicone was also purchased from Dow Corning, Midland, Mich. and was also identified as HIPEC® Q3-6646. The second layer was oven cured at a temperature of about 150° C. for about 120 min.

The silicone material for both layers 20 and 22 was chosen so that its glass transition temperature was outside the operating range of the package; that is, outside the range of −65° C. to +155° C.

After the second layer 22 was cured, a plastic lid 26 was snapped in place on top of the package.

It is to be understood that the above-described arrangements are merely illustrative of the many possible specific embodiments that can be devised to represent application of the principles of the invention. Numerous and varied other arrangements can be devised in accordance with these principles by those skilled in the art without departing from the spirit and scope of the invention.

In particular, our invention also addresses the problem of encapsulating components that protrude above the sidewalls of an open cavity package. In this case, the first gel layer would preferably fill as much of the cavity as possible without spilling over the sidewalls, and the dome-like second gel layer would cover the protrusions, and thus would itself extend above the sidewalls. Therefore, the lid would not be flat as shown in FIG. 2; rather it would also have a shape to accommodate the portion of the dome-like layer that extends above the sidewalls (e.g., the lid itself could be arched or dome-like).

We claim:

1. A semiconductor device package comprising:
a container having a base and side walls, said base and said side walls comprising an electrically insulating material,
at least one semiconductor device chip disposed on said base,
a lead frame extending through said side walls,
at least one electrical conductor coupling said lead frame to said at least one semiconductor device chip, characterized in that
a contiguous first-applied concave layer of an electrically insulating cured gel covers said at least one semiconductor device chip entirely and said lead frame, wherein the contiguous first-applied concave layer defines a contiguous concave shape relative to the base and has a contiguous bisecting cross section, and
a second-applied convex layer of an electrically insulating cured gel, applied after the contiguous first-applied concave layer, covers at least the portion of said contiguous first-applied concave layer that covers said at least one semiconductor device chip, but does not extend to said side walls, wherein:
said second-applied convex layer has a shape of a convex dome relative to the base;
said at least one electrical conductor is covered at both ends by the contiguous first-applied concave layer; and
an intermediate portion of said at least one electrical conductor extends above a top surface of said contiguous first-applied concave layer and into said second-applied convex layer.

2. The package of claim 1, wherein said electrically insulating cured gel comprises silicone.

3. The package of claim 2, wherein said base and said side walls comprise plastic.

4. The package of claim 3, wherein said plastic comprises a liquid crystal plastic.

5. The package of claim 1, further including a third-applied layer of conformal, electrically insulating material, applied after the second-applied convex layer and different from the electrically insulating cured gel of the second-applied convex layer, disposed on said second-applied convex layer and essentially filling said container.

6. The package of claim 5, wherein said third-applied layer comprises an epoxy material.

7. The package of claim 1, wherein said container includes a lid that encloses said layers therein.

8. The package of claim 1, wherein at least one of said at least one semiconductor device chip comprises an RFLDMOS chip.

9. A semiconductor device package comprising:
a container having a base and side walls connected to the base, each side wall have a top edge opposite the connection between the base and the side wall;
at least one semiconductor device chip disposed on the base;
at least one lead frame having a portion extending through at least one side wall;
at least one electrical conductor coupling the at least one lead frame to the at least one semiconductor device chip;
a contiguous first-applied concave layer of electrically insulating material covering the at least one semiconductor device chip and at least some of the portion of the at least one lead frame extending through the at least one side wall, wherein the contiguous first-applied concave layer defines a concave shape relative to the base and has a contiguous bisecting cross section; and
a second-applied convex layer of electrically insulating material applied after the contiguous first applied concave layer and disposed over at least a portion of the contiguous first-applied concave layer, wherein:
the second-applied convex layer has a shape of a convex dome relative to the base;
the at least one electrical conductor is covered at both ends by the contiguous first-applied concave layer;
an intermediate portion of the at least one electrical conductor extends above a top surface of the contiguous first-applied concave layer; and
the intermediate portion of the at least one electrical conductor extending above the top surface of the contiguous first-applied concave layer is covered by the second-applied convex layer.

10. A semiconductor device package comprising:
a container having a base and side walls connected to the base, each side wall have a top edge opposite the connection between the base and the side wall;
at least one semiconductor device chip disposed on the base;
at least one lead frame having a portion extending through at least one side wall;
at least one electrical conductor coupling the at least one lead frame to the at least one semiconductor device chip;
a contiguous first-applied concave layer of electrically insulating material covering the at least one semiconductor device chip and the portion of the at least one lead frame extending through the at least one side wall, wherein:
the contiguous first-applied concave layer defines a concave shape relative to the base and has a contiguous bisecting cross section; and the contiguous first-applied concave layer extends to each side wall at a location below the top edge of the side wall;
a second-applied convex layer of electrically insulating material applied after the contiguous first applied concave layer and disposed over at least a portion of the contiguous first-applied concave layer, wherein the second-applied convex layer has a shape of a convex dome relative to the base and the second-applied convex layer does not extend to any of the side walls; and
a third-applied layer of material, applied after the second-applied convex layer and different from the electrically insulating material of the second-applied convex layer, filling a remaining portion of the container not filled by the contiguous first-applied concave and second-applied convex layers, wherein:
the at least one electrical conductor is covered at both ends by the contiguous first-applied concave layer and an intermediate portion of the at least one electrical conductor extends above a top surface of the contiguous first-applied concave layer; and
the intermediate portion of the at least one electrical conductor extending above the top surface of the contiguous first-applied concave layer is covered by the second-applied convex layer.

11. The package of claim 10, wherein the contiguous first-applied concave layer forms a contact angle of less than 90 degrees with at least one side wall.

12. The package of claim 11, wherein the contact angle results from the electrically insulating material of the contiguous first-applied concave layer wicking up the at least one side wall.

13. The package of claim 10, wherein the contiguous first-applied concave layer forms a meniscus defining a concave shape relative to the base.

14. The package of claim 13, wherein the meniscus results from the electrically insulating material of the contiguous first-applied concave layer wicking up at least one side wall.

15. The package of claim 10, wherein the convex dome shape of the second applied convex layer is facilitated by relatively low wetting of the electrically insulating material of the second-applied convex layer on the electrically insulating material of the contiguous first-applied concave layer.

16. The package of claim 10, further comprising a lid connected to the top edges of the side walls and covering the container.

17. The package of claim 10, wherein:
the contiguous first-applied concave layer forms a meniscus defining the concave shape relative to the base and having a contact angle of less than 90 degrees with at least one side wall, wherein the meniscus results from the electrically insulating material of the contiguous first-applied concave layer wicking up the at least one side wall; and
the convex dome shape of the second-applied convex layer is facilitated by relatively low wetting of the electrically insulating material of the second-applied convex layer on the electrically insulating material of the contiguous first-applied concave layer.

18. The package of claim 10, wherein the concave shape of the contiguous first-applied concave layer corresponds to an upper surface of the contiguous first-applied concave layer.

19. The package of claim 9, wherein the concave shape of the contiguous first-applied concave layer corresponds to an upper surface of the contiguous first-applied concave layer.

20. The package of claim 9, wherein the concave shape of the contiguous first-applied concave layer corresponds to an upper surface of the contiguous first-applied concave layer.

* * * * *